United States Patent [19]

Suntken

[11] Patent Number: 5,396,447
[45] Date of Patent: Mar. 7, 1995

[54] MULTIPLIER CIRCUIT AND METHOD OF OPERATION THEREFOR

[75] Inventor: Artur W. Suntken, The Willows, South Africa

[73] Assignee: South African Micro-Electronic Systems (Proprietary) Limited, South Africa

[21] Appl. No.: 27,405

[22] Filed: Mar. 8, 1993

[30] Foreign Application Priority Data

Mar. 6, 1992 [ZA] South Africa ............... 92/1711

[51] Int. Cl.$^6$ ............................................. G06G 7/16
[52] U.S. Cl. ................................. 364/841; 364/606
[58] Field of Search ............ 364/841, 606, 807, 811, 364/602; 341/143; 328/160

[56] References Cited

U.S. PATENT DOCUMENTS

| | | | |
|---|---|---|---|
| 3,521,038 | 7/1970 | Gilbert | 364/606 |
| 3,546,441 | 12/1970 | Brendle . | |
| 3,655,955 | 4/1972 | Brendle . | |
| 3,728,535 | 4/1973 | Dickman | 364/606 |
| 3,780,273 | 12/1973 | Turrell | 364/606 |
| 3,914,591 | 10/1975 | Logan, Jr. | 364/606 |
| 3,955,138 | 5/1976 | Milkovic . | |
| 4,833,639 | 5/1989 | Keate | 364/841 |
| 4,920,312 | 4/1990 | Maruyama | 364/841 |
| 4,947,173 | 8/1990 | Okada et al. | 364/606 |
| 5,227,987 | 7/1993 | Imazawa et al. | 364/606 |

FOREIGN PATENT DOCUMENTS 969985 12/1990 South Africa .

*Primary Examiner*—Tan V. Mai
*Attorney, Agent, or Firm*—Jones, Day, Reavis & Pogue

[57] ABSTRACT

A multiplier circuit for obtaining the product of two input signals has a modulator for modulating a first input signal to produce an intermediate pulse train whose pulse density is dependent on the amplitude of the first input signal. A combiner derives from the second input signal and the intermediate pulse train a composite signal whose average value is equal to the product of the first and second input signals.

18 Claims, 3 Drawing Sheets

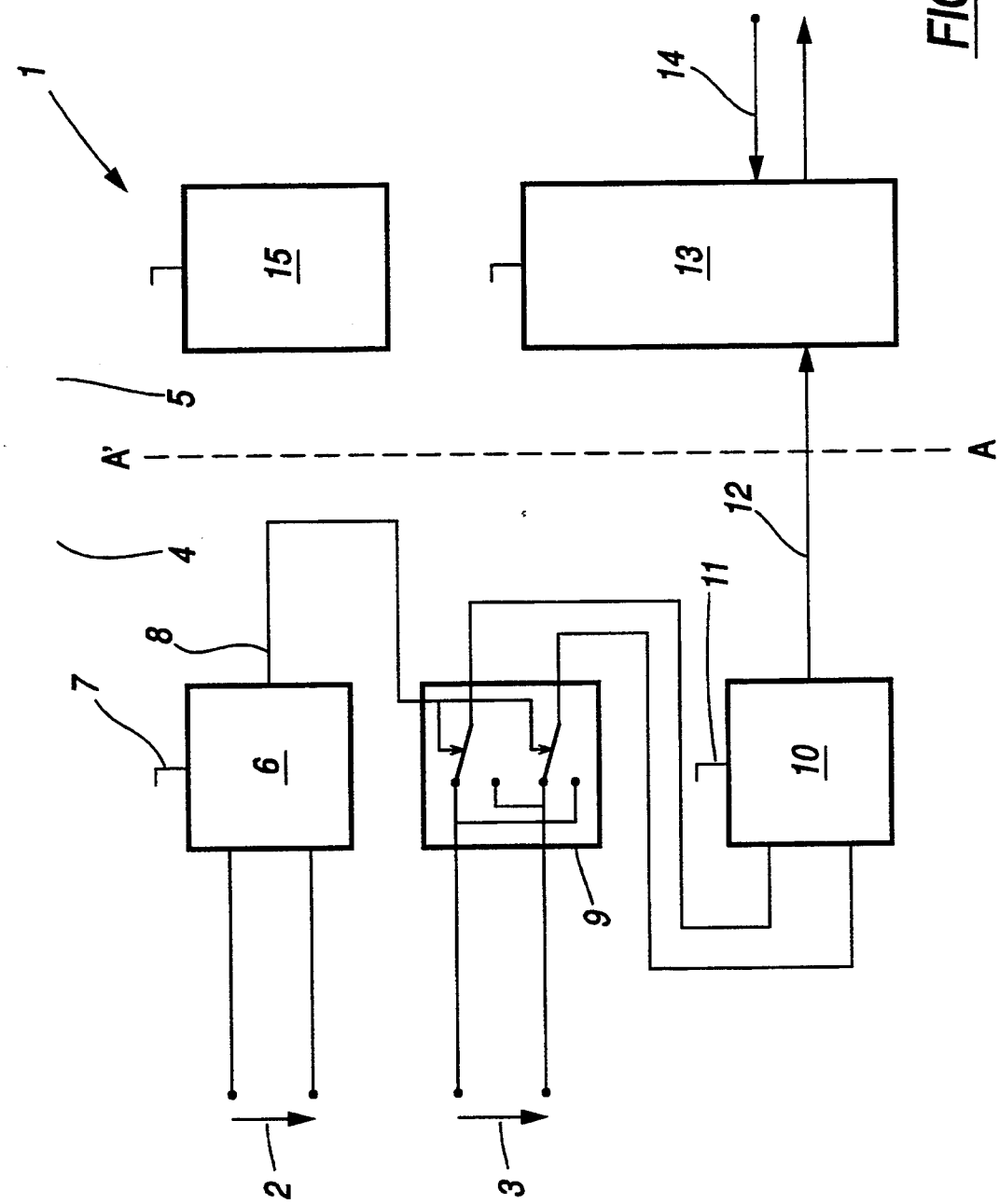

MULTIPLIER CIRCUIT AND METHOD OF OPERATION THEREFOR

INTRODUCTION

THIS INVENTION relates to a multiplier circuit and, more particularly but not exclusively, to a circuit for obtaining the product of two time-varying signals in power-metering applications.

BACKGROUND TO THE INVENTION

Several types of multiplier circuits are known in the art, these being analog multiplier circuits, digital signal processors, and time-division multipliers.

An analog multiplier circuit obtains the product of two time-varying signals directly in the analog domain. The product signal output by the analog multiplier circuit may be converted into a digital format by means of an analog-to-digital (A/D) output stage. In power metering applications, the two time-varying input signals represent the voltage and the current in an electrical distribution network. In order to compute energy or average power consumption, the output of the A/D output stage is integrated by means of a digital integrator.

Analog multiplier circuits have an inherent high frequency response, but have a disadvantage in that they exhibit poor linearity. Improvements to the linearity of analog multipliers are difficult and expensive to achieve, particularly where the multipliers are solid-state multipliers such as those implemented in CMOS technology. Similarly, temperature stability is also difficult to achieve in solid state analog multipliers. The only mathematical result available from this type of analog multiplier circuit is the product of the two input signals. Although this type of multiplier circuit has a high frequency response, this does not offer any advantage for power metering, which is largely a low-frequency application.

In a multiplier which is based on digital signal processing, the two analog time-varying input signals are converted into digital format, usually by means of oversampling A/D converters. The converted signals are then filtered, and the product of the two filtered signals is then obtained directly in the digital domain. As is the case with other types of multipliers, the output product signal may be integrated by means of a digital integrator in order to compute energy or power consumption in power metering applications.

This type of multiplier incorporates few analog circuits as signal multiplication is performed digitally. Oversampling A/D converters are standard components available in cell libraries for solid state implementation. Such multipliers exhibit good linearity, and analog circuit imperfections and component mismatches may be easily compensated.

A further advantage of this type of multiplier is that additional data, such as the phase shift between the input signals, or the frequency of the input signals, may be easily derived from the digitised input signals.

This type of multiplier is characterised by a high gate count due to the digital computations which must be performed. The high gate count requires a large semiconductor die size for solid-state implementation, which makes this type of multiplier uneconomic for low-cost applications such as power metering.

A further disadvantage of this type of multiplier is that additional memory storage must be provided for the input filter coefficients. This memory storage may be either on-chip, in which case the gate count increases further, or an external memory. This type of multiplier usually requires extensive software support, including both the filtering and multiplication algorithms.

In a time-division multiplier, one of the time-varying input signals is modulated to produce a pulse width modulated (PWM) signal. The PWM signal is used to control the polarity of the second signal into the input of an integrator. The output of the integrator is a signal representing the product of the two time-varying input signals. For power metering applications, the product signal is converted to a digital signal and is integrated by a digital integrator for computation of energy and average power consumption.

Time division multipliers are stable and have good linearity characteristics, but have the disadvantage that they require special purpose analog circuitry such as a pulse width modulator. Further, a time division multiplier produces only the product of the input signals, as well as its integral.

OBJECT OF THE INVENTION

It is an object of this invention to provide a multiplier which will, at least partially, alleviate the abovementioned difficulties.

SUMMARY OF THE INVENTION

In accordance with this invention, there is provided a multiplier circuit for obtaining the product of two input signals, comprising:
- a modulating means for modulating a first one of the input signals to produce an intermediate pulse signal whose pulse density is dependent on the amplitude of the first input signal; and
- combining means for combining the second of the input signals and the intermediate pulse signal to produce a composite signal whose average value is dependent on the product of the first and second input signals.

A further feature of the invention provides for a converting means for converting the composite signals to a stream of data pulses whose pulse density is dependent on the amplitude of the product of the first and second input signals.

Yet further features of the invention provide for the modulating means to be an analog-to-digital converter, preferably an oversampling analog-to-digital converter, for the converting means to be an analog-to-digital converter, preferably an oversampling analog-to-digital converter, for the combining means to be an inverter circuit for selectively inverting the polarity of the second input signal, and for the inverter circuit to be operable by the intermediate signal.

Preferably, the stream of data pulses output by the converting means is connectable to an integrating means, the integrating means is a digital integrator, and the digital integrator is a 22-bit integrator.

Still further features of the invention provide for the oversampling analog-to-digital converters to be one-bit second-order pulse density modulators, for the multiplier to include switching means to invert the first and second input signals to cancel offsets in these signals, for the multiplier to include means for generating a reference current, and for the reference current to be independent of temperature and of supply voltage.

Yet further features of the invention provide for the multiplier to have a serial data port; and for the serial port to conform to the RS232-C serial standard.

The invention extends to provide a method of obtaining the product of two input signals, comprising the steps of:

modulating a first one of the input signals to produce an intermediate pulse signal whose pulse density is dependent on the amplitude of the first input signal; and combining the second of the input signals and the intermediate pulse signal to produce a composite signal whose average value is dependent on the product of the first and second input signals.

There is also provided for the method to include the further step of converting the composite signal to a stream of data pulses whose pulse density is dependent on the amplitude of the product of the first and second input signals.

There is also provided for the method to include the further steps of:

integrating, by means of a digital integrator, the stream of data pulses produced by the converting means;

reading, at selectable times, the integrated value of the data pulses produced by the converting means, by means of a serial data port conforming to the RS232-C serial standard; and resetting, at selectable times, the output of the integrator to a known state, by means of the serial data port.

There is also provided for controlling the polarity of the second input signal by means of an inverter circuit, for cancelling offsets in the first and second input signals by utilising switching means to invert said first and second input signals; and generating a reference current which is independent of temperature and of supply voltage.

BRIEF DESCRIPTION OF THE DRAWING

A preferred embodiment of the invention is described below, by way of example only, and with reference to the accompanying drawings, in which:

FIG. 1 a functional block diagram of a multiplier in accordance with the invention;

DETAILED DESCRIPTION OF THE DRAWING

Figure 2A:
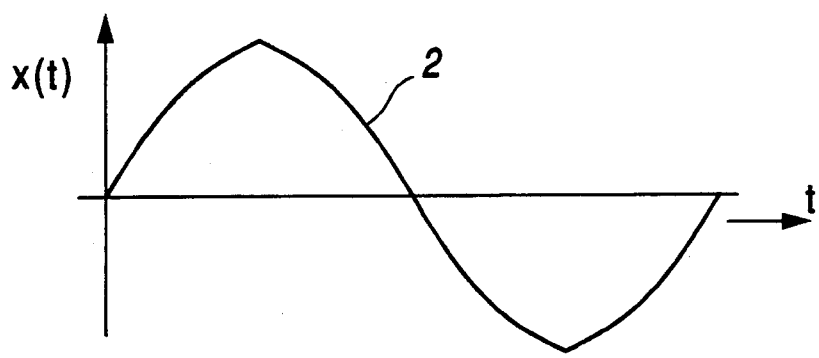
FIG. 2 is a timing diagram showing two time-varying input signals and the output product signal of the multiplier circuit of FIG. 1.
Figure 2B:
Figure 2C:
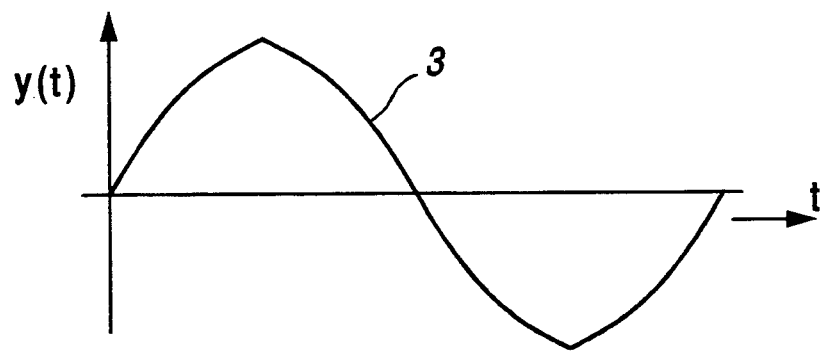
Figure 2D:
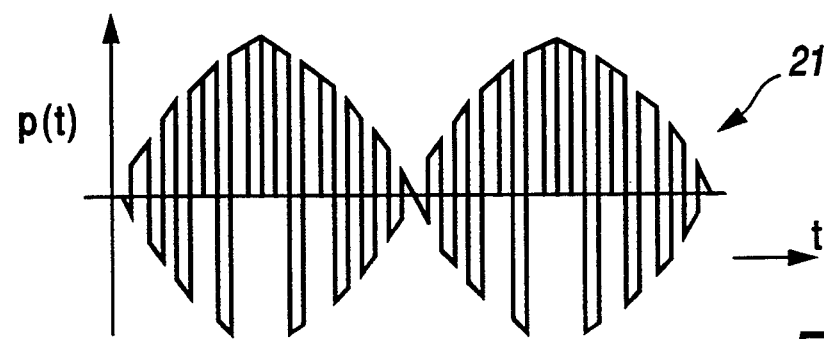

Referring to FIG. 1, a multiplier circuit is indicated generally by reference numeral (1). The multiplier circuit (1) obtains the product of two time-varying input signals (2) and (3). The multiplier (1) has an analog processing section (4) and a digital processing section (5) which are shown separated by line A-A' in FIG. 1.

A first time varying signal (2) is connected to the input of a first pulse density modulator (6). The pulse density modulator (6) is a second order oversampling A/D converter which is clocked, at (7) with a 1.8 MHz clock signal. The pulse density modulator (6) produces a one-bit pulse density modulated signal (8) whose average value is equal to the instantaneous value of the first time-varying input signal (2).

The second time varying input signal (3) is applied through a precision switching circuit (9) to the input of a second pulse density modulator (10). The switching circuit (9) is controlled by means of the output pulse stream (8) of the first modulator (6), to selectively invert the polarity of the second time varying input signal (3) which is applied to the second pulse density modulator (10).

The second pulse density modulator (10) is a second-order oversampling A/D converter which is clocked, at (11), by a 1.8 MHz clock signal. The output of the second pulse density modulator (10) is a one-bit pulse density modulated signal (12) whose average value is equal to the instantaneous value of the product of the two time varying input signals (2) and (3).

The pulse density modulated product signal (12) output by the second pulse density modulator (10) is integrated by an integrator (13).The integrator (13) is a 22-bit up/down counter. The maximum positive and negative counter values are Hex OFFFFF and Hex 100001 respectively, with the most significant bit of the counter representing the sign of the count.

The multiplier (1) includes an RS232C serial interface port (14) whose settings are: 19200 baud, 1 startbit, 1 stopbit, 8 data bits and no parity. The sixteen most significant bits of the counter value may be read via the serial interface port (14). In addition, the integrator (14) may be reset via the serial interface port (14), or its value may be read, followed immediately thereafter by a resetting of the counter value.

Prior to modulation in the manner described above, the first and second time-varying input signals (2) and (3) are each inverted by means of respective inversion circuits (not shown), in order to cancel any offsets present in the signals. The operation of the respective inversion circuits (not shown) is controlled by cyclical inverting signals produced by timing and control circuitry (15).

The multiplier circuit (1) includes an oscillator circuit (not shown) which is driven by a 3.58 MHz crystal. The oscillator frequency is divided down to 1.8 MHz, and this clock frequency is used to drive all the functional components of the multiplier circuit (1). A bandgap reference circuit (not shown) is used to generate a reference current which is independent of temperature and of supply voltage.

The operation of the multiplier (1) may be more clearly understood with reference to FIG. 2, in which features similar to those of FIG. 1 are indicated by like numerals. A sinusoidal first time-varying signal (2) is modulated by the first oversampling A/D converter (6) to produce a corresponding one-bit pulse density modulated signal (8).

A second sinusoidal time-varying input signal (3) is selectively inverted by means of the precision switching circuit (9) of FIG. 1. The switching circuit (9) is controlled by the pulse density modulated signal (8) to invert the second input signal (3) only during periods when the modulated signal (8) is low. The output of the switching circuit (9) is indicated generally by reference numeral (21) in FIG. 2 and represents the product of the modulated signal (8) and the second input signal (3).

The average value of the pulse density modulated signal (8) is equal to the instantaneous value of the first time-varying input signal (2). This implies that the average value of the output signal (21) is therefore equal to the instantaneous value of the product of the first and second input signals (2) and (3).

The transfer function of the oversampling A/D converter (6) is given, in the Z-transform domain, by $$G(Z) = \frac{H(Z)}{1 + H(Z)}$$

where H (Z) is the feedback gain of the A/D converter. The pulse density modulated output signal (8) of the A/D converter (6) in response to an input signal X(Z) is denoted by $$O(Z) = G(Z)X(Z)$$

The composite signal which is the product of the A/D converter-output signal (8) and the second input signal (3) is $$\begin{aligned} P(Z) &= O(Z) \cdot Y(Z) \\ &= G(Z) \cdot X(Z) \cdot Y(Z) \\ &= \frac{H(Z) \cdot X(Z) \cdot Y(Z)}{1 + H(Z)} \end{aligned}$$

At low frequencies, the feedback gain H (Z) of the A/D converter (6) will be large and the term $$\frac{H(Z)}{1 + H(Z)}$$

will tend to unity, yielding
ti P(Z)=X(Z).Y(Z).

In a preferred embodiment, the multiplier circuit (1) is implemented as a mixed-signal integrated CMOS circuit. The precision analog circuits such as the modulators (6) and (10), as well as the precision switching circuit (9) are available as standard building blocks in many mixed-signal cell libraries for the manufacture of integrated circuits. The CMOS technology operates at a supply voltage of 4.5 to 5.5 volts.

The CMOS implementation of the multiplier circuit (1) performs the multiplication of the two time-varying input signals (2) and (3) over a dynamic range of more than 60 dB with an accuracy of more than 1% across a temperature range from −10° C. to 70° C., thereby exhibiting good linearity and temperature stability.

Figure 3:
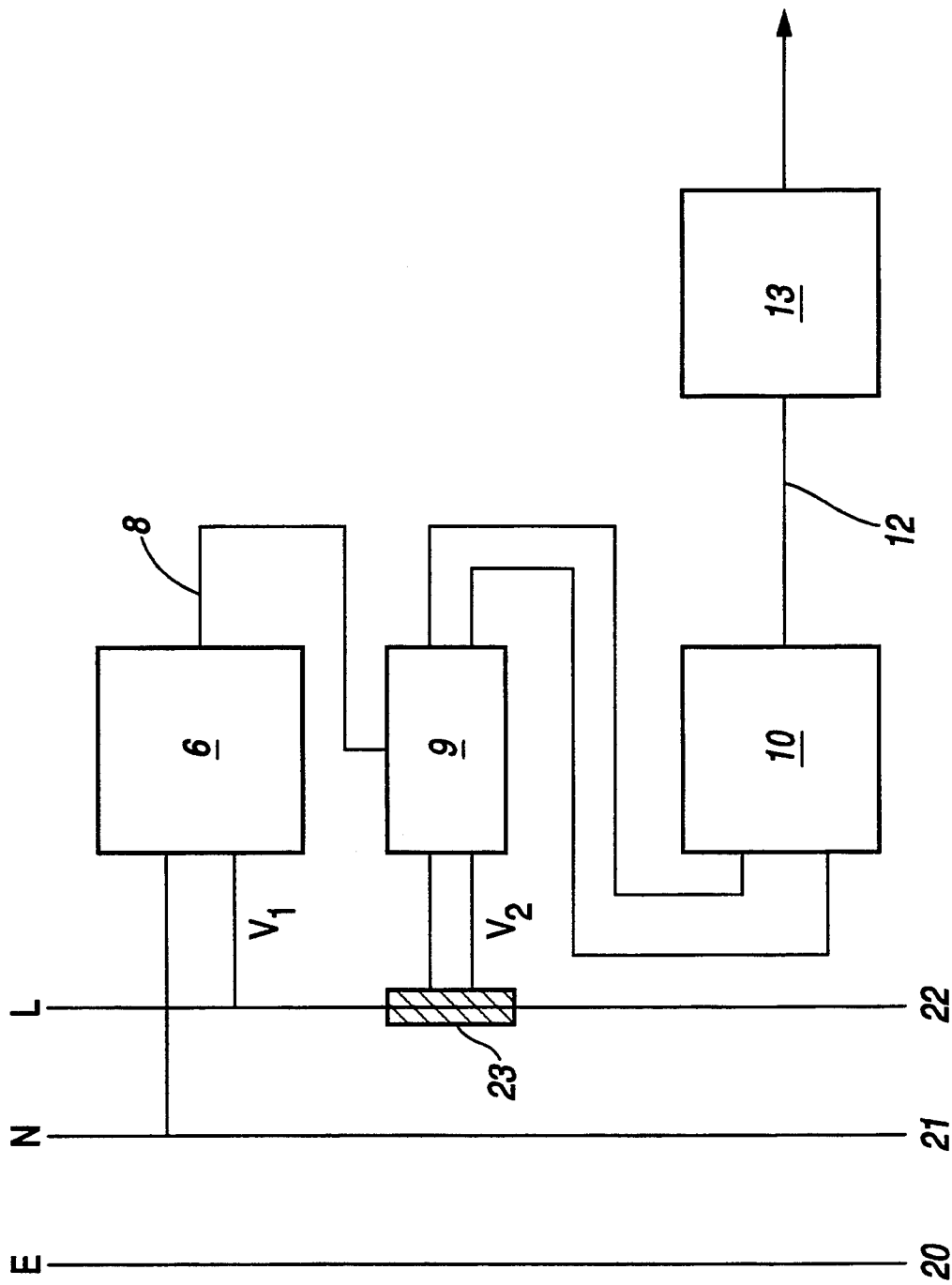
FIG. 3 is a block diagram of the multiplier of FIG. 1 shown in conjunction with an electricity supply network.

Referring now to FIG. 3 in which similar features to those in FIG. 1 are represented by like numerals, an application of the multiplier circuit (1) to the measurement of power in a single phase electrical supply is indicated. A voltage signal $V_1$ is measured directly across the neutral (21) and the live (22) conductors of the single phase electrical supply. The voltage signal $V_1$ is attenuated and connected to the input of the first pulse density modulator (6).

Current in the electrical supply is measured by means of a current sensor (23) in the live conductor (22) of the electricity supply. The current sensor (23) may be either a current transformer or a shunt resistor. The output of the current sensor is a voltage $V_2$ which is connected to the input of the switching circuit (9).

As previously described, the first pulse density modulator (6) produces a pulse density modulated signal (8) whose average value is equal to the instantaneous value of the voltage $V_1$. The output of the second pulse density modulator (10) is a pulse modulated signal (12) whose average value is equal to the instantaneous value of the product of the voltages $V_1$ and $V_2$. Since $V_2$ is proportional to the current in the electrical supply, the output signal of the second pulse density modulator (10) represents the instantaneous power in the supply.

The output signal (12) of the second pulse density modulator (10) is integrated by an integrator (13) in the manner described above. The output of the integrator (13) therefore represents the energy consumed by the single phase electrical supply.

It will be obvious to those skilled in the art that three multiplier circuits (1) may be used in combination to measure the energy and the power consumption in a three-phase electrical supply, by connecting each of the multiplier circuits to a different phase of the three phase supply in the manner described above.

Numerous modifications are possible to the above embodiment without departing from the scope of the invention. In particular, the switching circuit (9) may be dispensed with by using a switched-type oversampling A/D converter as the second pulse density modulator (10). The switched A/D converter may be either of the switched capacitor or switched current memory type. In this embodiment inversion of the second time-varying input signal may be achieved directly using the input stage of the switching A/D convertor (10), without the need for additional analog circuitry.

The invention therefore provides a multiplier which provides a high accuracy combined with a low circuit complexity. The multiplier achieves all the advantages offered by a time division multiplier, but with a greatly simplified analog circuitry.

What we claim as new and desire to secure by Letters Patent is:

1. A multiplier circuit for obtaining the product of first and second input signals comprising:

a first oversampling analog-to-digital converter for modulating said first one of said input signals to produce an intermediate pulse signal whose pulse density is dependent on the amplitude of said first input signal;

a second oversampling analog-to-digital converter for modulating said second one of the input signals to produce an output pulse signal whose pulse density is dependent on the amplitude of the product of said first and second input signals; and a switching device for receiving said second input signal, said switching device being coupled to both said first and second oversampling analog-to-digital converters for controlling the polarity of said second input signal applied to said second oversampling analog-to-digital converter by means of said intermediate pulse signal produced by said first oversampling analog-to-digital converter.

2. A multiplier circuit as claimed in claim 1 wherein said switching device is a separate switching circuit that is controlled by the intermediate signal produced by the first oversampling analog-to-digital converter to invert the 5polarity of said second input signal.

3. A multiplier circuit as claimed in claim 2 wherein each of said oversampling analog-to-digital converters is a switched current oversampling analog-to-digital converter.

4. A multiplier circuit as claimed in claim 1 wherein said switching device is an input stage in the second oversampling analog-to-digital converter that directly inverts the polarity of said second input signal.

5. A multiplier circuit as claimed in claim 4 wherein said second oversampling analog-to-digital converter is a switched capacitor oversampling analog-to-digital converter.

6. A multiplier circuit as claimed in claim 4 wherein said second oversampling analog to digital converter is a switched current memory oversampling analog-to-digital converter.

7. A multiplier circuit as claimed in claim 1 further comprising an integrating means for receiving said output pulse signal.

8. A multiplier circuit as claimed in claim 7 wherein said integrating means is a digital integrator.

9. A multiplier circuit as claimed in claim 1 wherein both of said first and second oversampling analog-to-digital converters are one-bit, second order pulse density modulators.

10. A multiplier circuit as claimed in claim 1 further including switching means to invert said first and second input signals to cancel offsets in said signals.

11. A multiplier circuit as claimed in claim 1 further including means for generating a reference current which is independent of temperature and of supply voltage.

12. A multiplier circuit as claimed in claim 1 wherein said multiplier includes a serial data port conforming to the RS232-C serial standard.

13. A method of obtaining the product of first and second input signals comprising the steps of:
  modulating said first one of the input signals by means of a first oversampling analog-to-digital converter to produce an intermediate pulse signal whose pulse density is dependent on the amplitude of the first input signal;
  modulating the second one of the input signals by means of a second oversampling analog-to-digital converter to produce an output pulse signal whose pulse density is dependent on the amplitude of the product of the first and second input signals; and.
  controlling the polarity of the second input signal applied to said second oversampling analog-to-digital converter with said intermediate pulse signal produced by said first oversampling analog-to-digital converter.

14. A method as claimed in claim 13 further comprising the step of controlling a separate switching circuit with the intermediate signal produced by the first oversampling analog-to-digital converter to invert the polarity of the second input signal applied to said second oversampling digital-to-analog converter.

15. A method as claimed in claim 13 further comprising the step of directly inverting the polarity of the second input signal using the input stage of the second oversampling analog-to-digital converter.

16. A method as claimed in claim 13 including the further steps of:
  integrating the output pulse signal by means of a digital integrator;
  reading, at selectable times, the integrated value of the output pulse signal by means of a serial data port conforming to the RS232-C serial standard; and
  resetting, at selectable times, the output of the integrator to a known state, by means of the serial data port.

17. A method as claimed in claim 13 further including the step of cancelling offsets in the first and second input signals by inverting said first and second input signals.

18. A method as claimed in claim 13 further comprising the step of generating a reference current that is independent of temperature and of supply voltage.

* * * * *